United States Patent
Ueta

(10) Patent No.: US 12,497,289 B2
(45) Date of Patent: Dec. 16, 2025

(54) QUANTUM DOT, SELF-LUMINOUS DEVICE, AND METHOD FOR MANUFACTURING QUANTUM DOT

(71) Applicant: SHARP KABUSHIKI KAISHA, Sakai (JP)

(72) Inventor: Yoshihiro Ueta, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 418 days.

(21) Appl. No.: 18/015,653

(22) PCT Filed: Jul. 13, 2020

(86) PCT No.: PCT/JP2020/027248
§ 371 (c)(1),
(2) Date: Jan. 11, 2023

(87) PCT Pub. No.: WO2022/013915
PCT Pub. Date: Jan. 20, 2022

(65) Prior Publication Data
US 2023/0255040 A1     Aug. 10, 2023

(51) Int. Cl.
*H10K 50/115* (2023.01)
*B82Y 20/00* (2011.01)
*B82Y 40/00* (2011.01)

(52) U.S. Cl.
CPC ............ *H10K 50/115* (2023.02); *B82Y 40/00* (2013.01); *B82Y 20/00* (2013.01)

(58) Field of Classification Search
CPC .. B82Y 40/00; Y10S 977/773; Y10S 977/774; Y10S 977/70; H10H 20/812; H10H 20/811; H10H 20/817; H10H 20/822; H10H 20/826; H10H 20/824; H10H 20/823; H10H 20/012; H10H 20/013; H10H 20/014; C09K 11/08; C01P 2004/64;
(Continued)

(56) References Cited

U.S. PATENT DOCUMENTS

| 4,990,189 A | * | 2/1991 | Wiese | ............ B82Y 30/00 |
| | | | | 106/459 |
| 5,759,213 A | * | 6/1998 | Adair | ............ C01F 7/448 |
| | | | | 423/625 |

(Continued)

FOREIGN PATENT DOCUMENTS

| JP | 2009173882 A | 8/2009 |
| JP | 2017025220 A | 2/2017 |

(Continued)

OTHER PUBLICATIONS

Huang et al., Facet-dependent properties of polyhedral nanocrystals (Year: 2014).*

(Continued)

*Primary Examiner* — Sophia T Nguyen
(74) *Attorney, Agent, or Firm* — ScienBiziP, P.C.

(57) ABSTRACT

A quantum dot includes: an inner barrier layer; a quantum well layer formed on at least a part of the inner barrier layer, wherein a presence or absence of the quantum well layer or a thickness of the quantum well layer varies from location to location on the inner barrier layer; and an outer barrier layer formed on a surface of the quantum well layer opposite to a surface adjacent to the inner barrier layer.

18 Claims, 10 Drawing Sheets

(58) Field of Classification Search
CPC .............. C01P 2002/30; C01P 2002/60; C01P 2004/00; C01P 2004/30; C01P 2004/38; C01P 2004/41; C01P 2004/45; C01P 2004/90; H10K 50/115
See application file for complete search history.

(56) References Cited

U.S. PATENT DOCUMENTS

| | | | | |
|---|---|---|---|---|
| 7,691,765 | B2* | 4/2010 | Suzuki | C04B 35/44 501/153 |
| 8,470,724 | B2* | 6/2013 | Taira | C04B 35/6455 252/584 |
| 10,518,331 | B2* | 12/2019 | Mirkin | B22F 1/065 |
| 10,686,195 | B2* | 6/2020 | Yang | H01M 4/8657 |
| 12,302,670 | B2* | 5/2025 | Ueta | H10H 20/01 |
| 2003/0017264 | A1* | 1/2003 | Treadway | C09K 11/565 428/402.2 |
| 2006/0057382 | A1* | 3/2006 | Treadway | C09K 11/54 428/404 |
| 2007/0298160 | A1* | 12/2007 | Jang | C09D 1/00 106/287.18 |
| 2009/0081100 | A1* | 3/2009 | Suzuki | C04B 35/62886 264/681 |
| 2009/0212265 | A1* | 8/2009 | Steinhardt | C08F 222/385 252/501.1 |
| 2009/0242871 | A1 | 10/2009 | Kobayashi et al. | |
| 2010/0140586 | A1* | 6/2010 | Char | C01G 11/00 257/14 |
| 2010/0283037 | A1 | 11/2010 | Omata et al. | |
| 2011/0220194 | A1* | 9/2011 | Kurtin | C09K 11/565 136/256 |
| 2011/0226991 | A1* | 9/2011 | Treadway | B82Y 10/00 977/773 |
| 2012/0149555 | A1* | 6/2012 | Sakamoto | B01J 23/892 502/185 |
| 2012/0202006 | A1* | 8/2012 | Rimer | C01B 39/54 428/131 |
| 2012/0235076 | A1* | 9/2012 | Iftime | C09C 1/62 252/62.54 |
| 2013/0112940 | A1* | 5/2013 | Kurtin | H01L 21/02557 257/14 |
| 2013/0115455 | A1* | 5/2013 | Banin | C09K 11/883 977/773 |
| 2013/0133483 | A1* | 5/2013 | Yang | B22F 1/0553 75/363 |
| 2014/0166945 | A1* | 6/2014 | Kurtin | H10F 77/12 252/500 |
| 2014/0166973 | A1* | 6/2014 | Kurtin | C09K 11/08 438/46 |
| 2014/0170789 | A1* | 6/2014 | Kurtin | H10H 20/8512 977/890 |
| 2014/0193841 | A1* | 7/2014 | Welch | G01N 33/581 435/7.92 |
| 2015/0069015 | A1* | 3/2015 | Xia | C30B 29/52 216/41 |
| 2015/0360964 | A1* | 12/2015 | Rimer | B01J 35/77 423/700 |
| 2016/0333267 | A1* | 11/2016 | Chen | C09K 11/883 |
| 2016/0341397 | A1* | 11/2016 | Zhao | H10H 20/8512 |
| 2016/0369975 | A1* | 12/2016 | Chen | C09K 11/883 |
| 2017/0088775 | A1* | 3/2017 | Park | C09K 11/02 |
| 2017/0110625 | A1* | 4/2017 | Zhao | H10H 20/8512 |
| 2017/0117147 | A1* | 4/2017 | Lieber | H01L 21/31116 |
| 2017/0183565 | A1* | 6/2017 | Jun | C09K 11/025 |
| 2017/0199179 | A1* | 7/2017 | Xia | G01N 33/582 |
| 2017/0213924 | A1* | 7/2017 | Kubo | C01B 33/021 |
| 2017/0352779 | A1* | 12/2017 | Kuzumoto | C08K 9/08 |
| 2017/0355903 | A1 | 12/2017 | Kazama et al. | |
| 2017/0369779 | A1* | 12/2017 | Owen | C01B 19/007 |
| 2018/0033856 | A1* | 2/2018 | Kwon | H10F 77/1215 |
| 2018/0138340 | A1* | 5/2018 | Kurtin | C09K 11/02 |
| 2018/0201834 | A1* | 7/2018 | Banin | C09K 11/883 |
| 2018/0214943 | A1* | 8/2018 | Xia | B22F 9/24 |
| 2018/0339345 | A1* | 11/2018 | Chopra | B22F 9/24 |
| 2019/0128894 | A1* | 5/2019 | Jain | C23C 16/403 |
| 2019/0391461 | A1* | 12/2019 | Barquero Garro | H10D 48/3835 |
| 2020/0203561 | A1* | 6/2020 | Chen | H10H 20/812 |
| 2021/0102120 | A1* | 4/2021 | Kim | G03F 7/033 |
| 2021/0106000 | A1* | 4/2021 | Lee | A23B 2/85 |
| 2021/0207025 | A1 | 7/2021 | Kazama et al. | |
| 2021/0324268 | A1* | 10/2021 | Yang | G02B 6/005 |
| 2021/0355380 | A1* | 11/2021 | Park | C09K 11/565 |
| 2022/0195298 | A1* | 6/2022 | Moriyama | B82Y 20/00 |
| 2022/0267672 | A1* | 8/2022 | Yeh | C09K 11/883 |
| 2022/0416131 | A1* | 12/2022 | Ueta | H10K 50/115 |
| 2024/0052241 | A1* | 2/2024 | Yeh | C09K 11/0883 |
| 2025/0056922 | A1* | 2/2025 | Kitano | C09K 11/0805 |

FOREIGN PATENT DOCUMENTS

| | | |
|---|---|---|
| WO | 2007142203 A1 | 12/2007 |
| WO | 2016125435 A1 | 8/2016 |

OTHER PUBLICATIONS

Barron et al., Using structural diversity to tune the catalytic performance of Pt nanoparticle ensembles (Year: 2015).*

* cited by examiner

1

QUANTUM DOT, SELF-LUMINOUS DEVICE, AND METHOD FOR MANUFACTURING QUANTUM DOT

TECHNICAL FIELD

The disclosure relates to a quantum dot, a self-luminous device, and a method for manufacturing a quantum dot.

BACKGROUND ART

Using a quantum dot as the light-emitting material of a light-emitting device is a known technique. Patent Literature 1 for instance discloses a semiconductor nanoparticle (quantum dot) that includes a core part (core) and a shell part (shell) covering the core part.

CITATION LIST

Patent Literature

Patent Literature 1: Japanese Unexamined Patent Application Publication No. 2017-25220 (published on Feb. 2, 2017)

SUMMARY

Technical Problem

When the quantum dot disclosed in Patent Literature 1 is used as the light-emitting material of a light-emitting device, the shell of the quantum dot strongly and three-dimensionally confines carriers injected into the core of the quantum dot. The quantum dot thus has a high probability of occurrence of an Auger recombination process of the injected carries. Accordingly, the light-emitting device that includes the quantum dot disclosed in Patent Literature 1 has a low probability of occurrence of a light-emission process in the quantum dot, thereby unfortunately lowering light emission efficiency.

One aspect of the disclosure aims to improve the light emission efficiency of a light-emitting device that contains a quantum dot as a light-emitting material.

Solution to Problem

To solve the above problem, a quantum dot according to one aspect of the disclosure includes the following: an inner barrier layer; a quantum well layer formed on at least a part of the inner barrier layer, wherein the presence or absence of the quantum well layer or the thickness of the quantum well layer varies from location to location on the inner barrier layer; and an outer barrier layer formed on a surface of the quantum well layer opposite to a surface adjacent to the inner barrier layer.

It is noted that the quantum dot refers to a particle that includes a portion where the thickness of the quantum well layer is about 100 nm or smaller, and that the maximum diameter or maximum width of the quantum dot per se is non-limiting.

It is also noted that the quantum well layer needs to have the same thickness at least partly, as clearly understood from the gist of the disclosure, and does not necessarily need to have a film shape on a base. For instance, the thickness of the quantum well layer may be as large as its width.

Further, a self-luminous device according to one aspect of the disclosure includes a light-emitting layer containing the quantum dot.

Further, a method for manufacturing a quantum dot according to one aspect of the disclosure includes the following: an inner-barrier-layer formation step of forming an inner barrier layer; a quantum-well-layer formation step of forming a quantum well layer onto at least a part of the inner barrier layer, wherein the presence or absence of the quantum well layer or the thickness of the quantum well layer varies from location to location on the inner barrier layer; and an outer-barrier-layer formation step of forming an outer barrier layer onto a surface of the quantum well layer opposite to a surface adjacent to the inner barrier layer.

Advantageous Effect

The aspects of the disclosure can offer a quantum dot with a low probability of occurrence of Auger recombination and with improved light emission efficiency, and the aspects can offer a light-emitting device that includes the quantum dot.

DESCRIPTION OF EMBODIMENTS

First Embodiment

Figure 1:
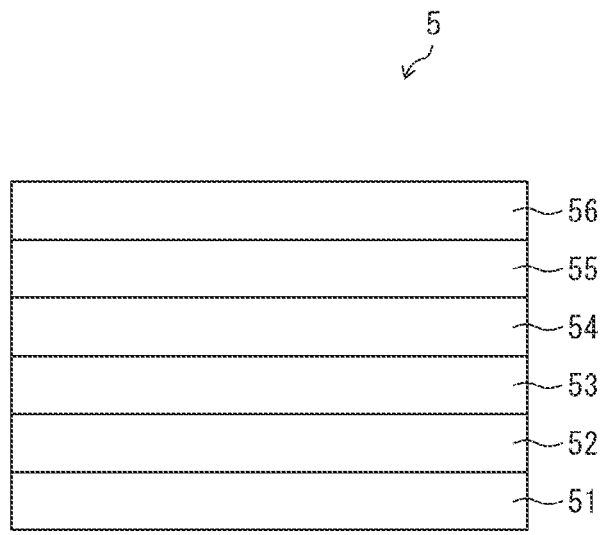
FIG. 1 is a schematic sectional view of a self-luminous device according to a first embodiment of the disclosure.

FIG. 1 is a schematic sectional view of a self-luminous device 5 according to the first embodiment of the disclosure. The self-luminous device 5 is a top-emission device of forward structure and includes an anode 51, a hole injection layer 52, a hole transport layer 53, a light-emitting layer 54, an electron transport layer 55, and a cathode 56.

Each layer of the self-luminous device 5 can be produced through film formation, including colloidal-solution application, application and baking, sputtering by the use of a metal mask, photolithography, resin filling, ashing, and dry/wet etching, and through patterning.

Anode 51

The anode 51 is an electrode containing a conductive material. When the self-luminous device 5 is a top-emission type of forward structure, the anode 51 is preferably a reflective electrode in order to improve take-out efficiency. The anode 51, when being a reflective electrode, may be made of Al, Ag or an alloy of them for instance. Nevertheless, the anode 51 may be made of a transparent conductive material; in this case, the anode 51 preferably contains indium tin oxide (ITO) in view of level conformance with the hole injection layer 52, which will be described later on. The anode 51 may be produced by forming films of individual materials through sputtering. The anode 51 is 100 nm or smaller thick for instance. Other than the foregoing, the anode 51 may be formed by providing an Al or Ag reflective layer under an ITO conductive layer with an insulating layer of polyimide or other materials interposed therebetween. In this case, contact holes for connecting the ITO, which is a conductive layer, and TFTs together may be formed in the insulating layer and reflective layer through photolithography.

Hole Injection Layer 52

The hole injection layer 52 is a layer that contains a hole injection material, and that has the function of enhancing the efficiency of hole injection from the positive electrode into the hole transport layer 53, which will be described later on. An organic material, when used for the hole injection layer 52, is preferably PEDOT that has a HOMO level conforming to the work function of the anode 51. The hole injection layer 52 may be produced by, for instance, applying a PEDOT-containing material, followed by curing the PEDOT at about 150 degrees centigrade.

The hole injection layer 52 is preferably an inorganic substance in order to improve the long-term reliability of the self-luminous device 5. The hole injection layer 52 needs to be made of a typically used inorganic material, including NiO, $LaO_3$, LaNiO, ZnO, and MgZnO, all of which are p-type materials, and including $MoO_3$ and $WO_3$, both of which have deep CBM and are n-type materials, and particularly needs to be made of, but not limited to, a metal oxide. The hole injection layer 52 can be formed through sputtering or evaporation. Nevertheless, the hole injection layer 52, when can be made of a nanoparticle material, can be formed by applying a suitable colloidal solution.

It is noted that the hole injection layer 52 is not essential and may be thus omitted in accordance with a desired device structure and a desired device characteristic.

Hole Transport Layer 53

The hole transport layer 53 is a layer that contains a hole transport material, and that has the function of enhancing the efficiency of hole transport to the light-emitting layer 54. When the hole transport layer 53 is made of an organic material, preferable examples of the organic material include PVK, TFB and poly TPD, all of which have a HOMO level that conforms to the material of the light-emitting layer. Further, the hole transport layer 53 may be made of a metal oxide, such as NiO, MgNiO, MgNiO, or LaNiO, that has a VBM conforming to the material of the light-emitting layer or may be made of a semiconductor material, such as p-type ZnO. The hole transport layer 53, when made of PVK for instance, may be formed by applying a solution with PVK dissolved in a solvent, such as toluene. Further, the hole transport layer 53, when made of an inorganic material, needs to be formed through sputtering or evaporation. The hole transport layer 53, when containing a material that can be processed into nanoparticles, may be formed through application.

Light-Emitting Layer 54

The light-emitting layer 54 contains a quantum dot 1. The structure of the quantum dot 1 will be detailed with reference to other drawings.

Electron Transport Layer 55

The electron transport layer 55 is a layer that contains an electron transport material, and that has the function of enhancing the efficiency of electron transport to the light-emitting layer 54. The electron transport layer 55 can be made of a ZnO inorganic material, such as ZnO, IZO, ZAO, or ZnMgO, or can be made of $TiO_2$. Nevertheless, the material of the electron transport layer 55 is not limited to the foregoing; the electron transport layer 55 may contain an organic material. The electron transport layer 55 is formed through, for instance, sputtering or colloidal-solution application.

Cathode 56

The cathode 56 is an electrode containing a conductive material. The cathode 56 is formed through, similarly to the electron transport layer 55, evaporation or sputtering of a known metal, such as Al or Ag, that has a relatively small work function.

Although the self-luminous device 5 according to this embodiment is a top-emission device, the self-luminous device may be a bottom-emission device. When the self-luminous device 5 is a top-emission device, the anode 51 may be a transparent electrode, and the cathode 56 may be a reflective electrode. The self-luminous device 5 may be of forward structure or inverted structure. The self-luminous device 5, when being of inverted structure for instance, may have a structure where the individual layers are stacked in an order opposite to the stacking order shown in FIG. 1.

Each of the foregoing layers can be replaced, as appropriate, with a material, if any, that has a better characteristic, to constitute the device.

Structure of Quantum Dot 1

Figure 2:
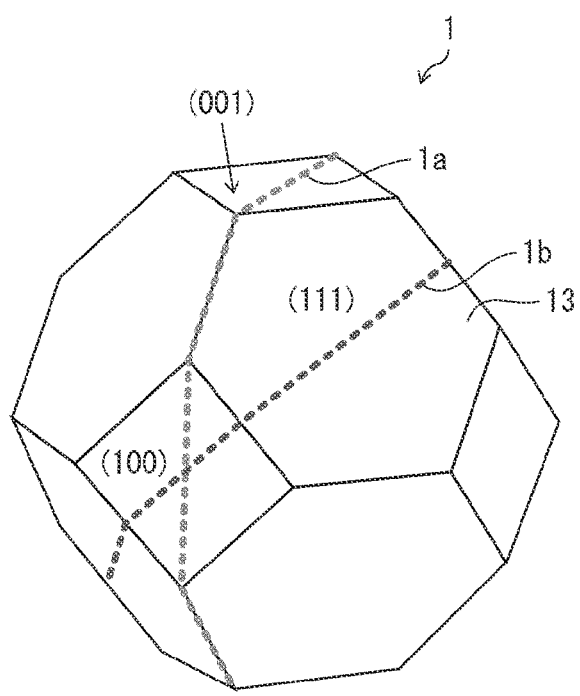
FIG. 2 is a perspective view of the structure of a quantum dot according to the first embodiment of the disclosure.
Figure 3:
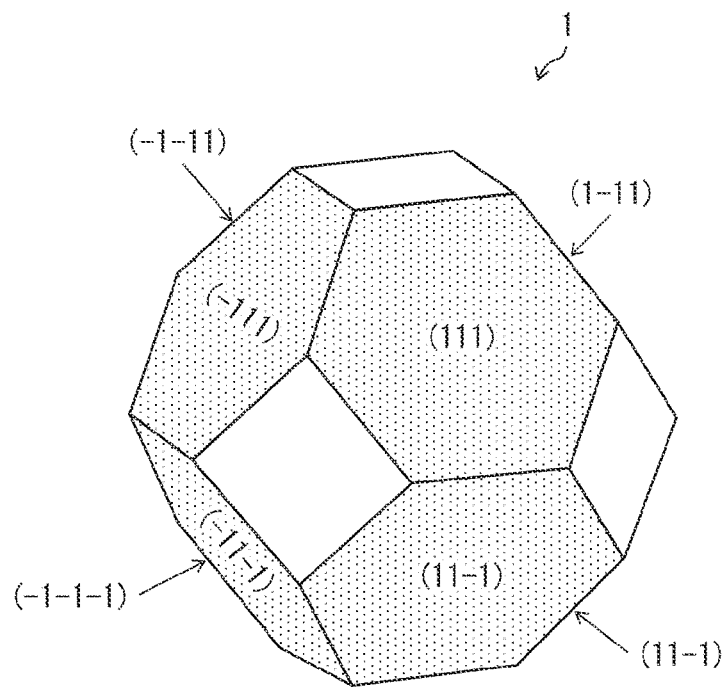
FIG. 3 illustrates the face orientations of the individual crystal faces of the quantum dot according to the first embodiment of the disclosure.
Figure 4:
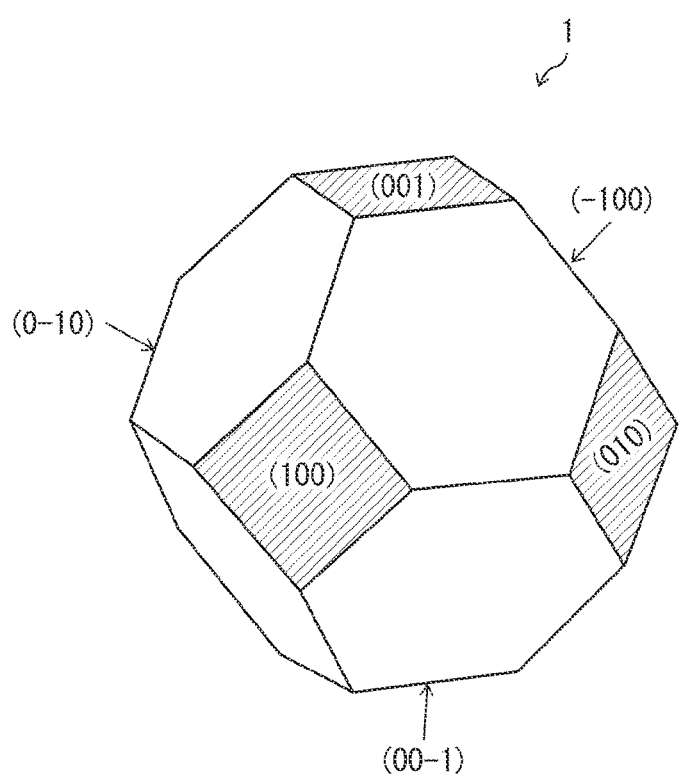
FIG. 4 illustrates the face orientations of the individual crystal faces of the quantum dot according to the first embodiment of the disclosure.
Figure 5:
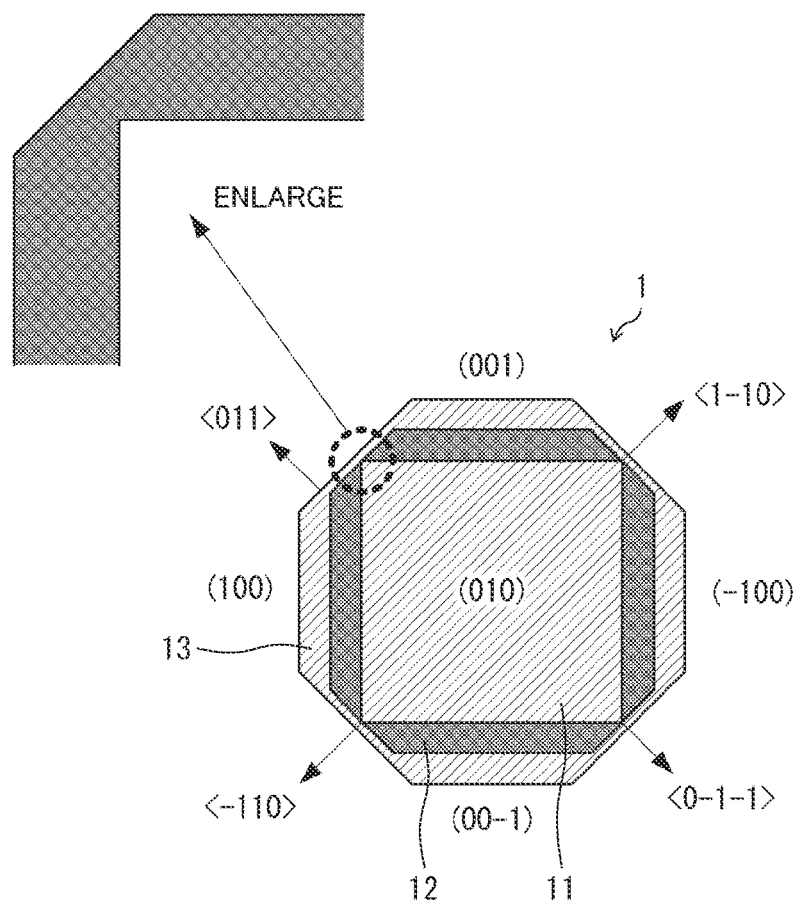
FIG. 5 is a sectional view of the quantum dot according to the first embodiment of the disclosure.
Figure 6:
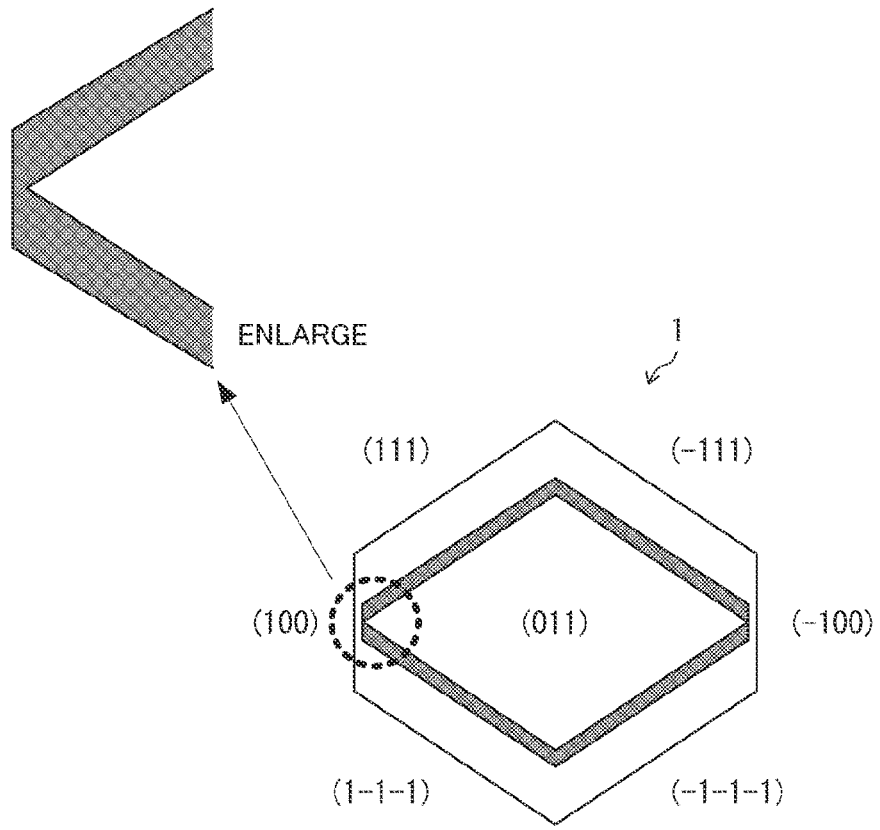
FIG. 6 is a sectional view of the quantum dot according to the first embodiment of the disclosure.

FIG. 2 is a perspective view of the structure of the quantum dot 1 according to this embodiment. FIGS. 3 and 4 illustrate the face orientations of the individual crystal faces of the quantum dot 1. Further, FIG. 5 is a sectional view of the quantum dot 1 taken along a plane 1a shown in FIG. 2, and FIG. 6 is a sectional view of the quantum dot 1 taken along a plane 1b shown in FIG. 2. The quantum dot 1 includes an inner barrier layer 11, a quantum well layer 12, and an outer barrier layer 13, as illustrated in FIGS. 2 to 6.

Inner Barrier Layer 11

The inner barrier layer 11 is a polyhedron crystal having a plurality of crystal faces. The inner barrier layer 11 in this embodiment is a tetradecahedron having the following, as illustrated in FIGS. 3 and 4: (a) (100), (−100), (010), (0−10), (001), and (00−1) faces that are quadrangular; and (b) (111), (−111), (1−11), (−1−11), (11−1), (−11−1), (1−1−1), and (−1−1−1) faces that are hexagonal.

FIG. 3 illustrates crystal faces of the quantum dot 1 that are equivalent to the (111) face. The faces equivalent to the (111) face are illustrated in FIG. 3 with hatches. Among the crystal faces of the quantum dot 1, the (−111), (1−11), (−1−11), (11−1), (−11−1), (1−1−1), and (−1−1−1) faces are equivalent to the (111) face. FIG. 4 illustrates crystal faces of the quantum dot 1 that are equivalent to the (100) face. The faces equivalent to the (100) face are illustrated in FIG. 4 with hatches. Among the crystal faces of the quantum dot 1, the (−100), (010), (0−10), (001), and (00−1) faces are equivalent to the (100) face.

The inner barrier layer 11 preferably has a size of 10 nm or smaller. The inner barrier layer 11 has a size of 6 nm or smaller for instance. It is noted that the Description defines the size of the inner barrier layer 11 as the diameter of a circumscribed sphere of the inner barrier layer 11.

In film formation through application of a colloidal solution containing dispersed nanoparticles, (1) non-aggregation of the nanoparticles within the solution, and (2) non-inhibition of the solvent's flow are required in order to establish a uniform thickness everywhere and to make surface asperities small. To satisfy (1), ligands need to coordinate with the surfaces of the nanoparticles at high density with respect to the volume of the nanoparticles within the applied colloidal solution. To satisfy (2), the nanoparticles within the applied colloidal solution need to have small inertia with respect to the viscosity of the solvent of the applied colloidal solution. Here, both (1) and (2) are satisfied when the nanoparticles within the colloidal solution have a small size. The nanoparticles thus preferably have a size of 10 nm or smaller in view of such a size as not to affect the flowability of the colloidal solution. In other words, a size of 10 nm or smaller enables the light-emitting layer 54 (see FIG. 1) of the light-emitting device to be uniformly formed through application or other methods. It is noted that a size of over 10 nm can obtain a desired light emission property, but the area of each divided quantum well layer 12 enlarges at the square of the size, thus unfavorably increasing light-emission half-value breadth in some cases.

It is noted that the minimum size of the nanoparticles within the colloidal solution depends on the size of a quantum well for the nanoparticles to emit visible light; in other words, the minimum size depends on the emission wavelength of the nanoparticles. The minimum size of the nanoparticles within the colloidal solution is thus determined by the emission wavelength of the nanoparticles.

Quantum Well Layer 12

The quantum well layer 12 is formed on at least a part of the inner barrier layer 11. Here, the presence or absence of the quantum well layer 12 or the thickness of the quantum well layer 12 varies from location to location on the inner barrier layer 11. In this embodiment in particular, the thickness of the quantum well layer 12 varies from face orientation to face orientation. It is noted that in the Description, "the presence or absence of the quantum well layer 12 or the thickness of the quantum well layer 12 varies" encompasses that the quantum well layer 12 has a portion having a thickness, and a portion having zero thickness, i.e., without thickness.

In the quantum dot 1, the quantum well layer 12 formed on a crystal face equivalent to the (111) face is thicker than the quantum well layer 12 formed on a crystal face equivalent to the (100) face, as illustrated in FIG. 6. As described, the thickness of the quantum well layer 12 varies from face orientation to face orientation. In other words, the quantum well layer 12 has a plurality of thicknesses.

Further, in the quantum dot 1, the quantum well layer 12 in the face orientation of a crystal face equivalent to the (100) face is thicker than the quantum well layer 12 in the face orientations (011), (1−10), (0−1−1) and (−110), as illustrated in FIG. 5.

The thickness of the quantum well layer 12, which is an important parameter for determining the degree of quantum confinement, is regulated in correspondence with a desired emission wavelength. For instance, the quantum well layer 12, when made of ZnSe, is preferably 6 nm thick, 5 nm thick, and 3 nm thick for the emission wavelength of R, the emission wavelength of G, and the emission wavelength of B, respectively. The quantum well layer 12 in this case has a thickness of 3 to 6 nm inclusive for instance. It is noted that the quantum well layer 12 has a uniform thickness in a single face orientation of the quantum dot 1.

Outer Barrier Layer 13

The outer barrier layer 13 is formed on a surface of the quantum well layer 12 opposite to a surface adjacent to the inner barrier layer 11. The presence or absence of the outer barrier layer 13 or the thickness of the outer barrier layer 13 varies from face orientation to face orientation. The outer barrier layer 13 has a thickness of 3 to 6 nm inclusive for instance. Within this range, a quantum effect can enlarge a band gap toward a conduction band and can cover the quantum well layer 12 completely without exposure. Enlarging the band gap can prevent electrons injected into the quantum well layer 12 from seeping outside a wave function, thus keeping the quantum level of the quantum well layer 12 constant. This effect leads to stabilization of the emission wavelength and prevention of increase in the half-value breadth.

Further, the outer barrier layer 13, when being 6 nm or smaller thick, can enlarge the band gap sufficiently and can render the size of the quantum dot suitable for forming the light-emitting layer.

Figure 7:
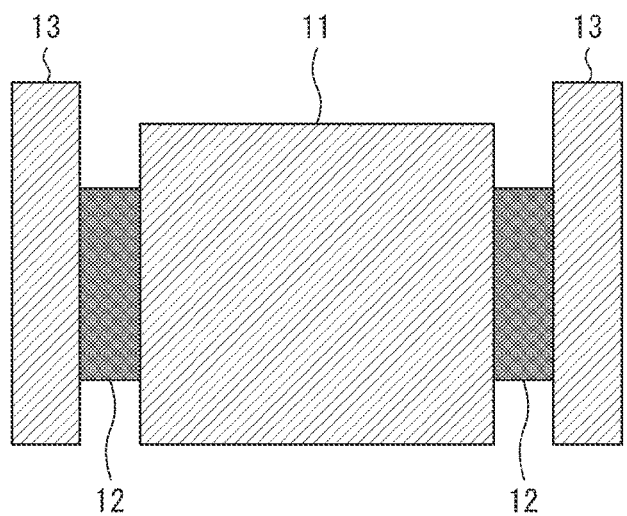
FIG. 7 illustrates a band structure according to the first embodiment of the disclosure.

FIG. 7 illustrates the band structure of the quantum dot 1. The band gap of the quantum well layer 12 is smaller than the band gap of the inner barrier layer 11. Further, the band gap of the outer barrier layer 13 is larger than the band gap of the quantum well layer 12. Further, the band gap of the outer barrier layer 13 is smaller than the band gap of the inner barrier layer 11.

The quantum dot 1 does not perform radiative recombination in the inner barrier layer 11, which mainly constitutes the quantum dot 1, but performs radiative recombination in the quantum well layer 12, which is formed near the surface of the quantum dot 1.

Quantum Dot Structure According to Comparative Embodiment

The following describes a quantum dot according to a comparative embodiment in order to describe effects of the quantum dot 1 according to the disclosure. The quantum dot according to the comparative embodiment has a core-shell structure consisting of the following: a nanosized core with which a quantum level that corresponds to R, G, and B emission wavelengths is obtained; and a shell covering the core's perimeter and having a wider band gap than the core. The quantum dot according to the comparative embodiment thus has a structure where the shell three-dimensionally and strongly confines carriers injected into the core.

Here, upon carrier injection into the core of the quantum dot, energy produced by electron-and-hole recombination is transferred to another electron, thus providing an Auger process in some cases, where a high-energy Auger electron is generated. The Auger process is known to have a higher recombination rate along with decrease in region where the carriers are confined.

Such an Auger process, which does not contribute to radiative recombination, lowers the light emission efficiency of the quantum dot considerably. Further, an Auger electron, which has high energy, sometimes goes outside over the shell of the quantum dot. The energy of the Auger electron about doubles the band gaps of quantum dots that emit R, G and B light, and it corresponds to the energy of near-ultraviolet light. Accordingly, an Auger electron gone outside the quantum dot attacks a ligand coordinating around the quantum dot to dissolve the ligand and activates a surface defect, thereby lowering the light emission efficiency or carrier injection efficiency of the quantum dot. Further, the ligand dissolution lowers the reliability of the quantum dot, and by extension, the reliability of a light-emitting device. In addition, the Auger recombination causes an ineffective current, which does not contribute to light emission, to generate heat in a light-emitting device that has the quantum dot according to the comparative embodiment, thereby deteriorating the quantum dot; hence, the light emission efficiency of the light-emitting device further lowers, thus shortening its lifetime.

It is noted that the probability of occurrence of Auger recombination depends on the density of carriers that are injected into a quantum dot. Thus, a light-emitting device that includes the quantum dot according to the comparative embodiment has a high probability of occurrence of Auger recombination more conspicuously when driven at a high current.

Effects of this Embodiment

In the quantum dot 1 according to this embodiment, the quantum well layer 12, formed between the inner barrier layer 11 and the outer barrier layer 13, involves recombination of carriers injected into the quantum dot 1. The quantum well layer 12, which confines carriers weakly in the in-plane direction of each crystal face, confines the injected carriers two-dimensionally. The quantum well layer 12 can thus confine the injected carriers two-dimensionally and weakly rather than three-dimensionally and strongly.

The quantum well layer 12 confines the carriers relatively weakly; hence, a region where the carriers are confined in the quantum dot 1 is wider effectively than it is in an instance where the carriers are confined three-dimensionally. Accordingly, the probability of occurrence of carrier Auger recombination in the quantum well layer 12 is reduced, and the probability of Auger electron generation is reduced as well.

For this reason, a light-emitting device that includes the quantum dot 1 according to this embodiment has a high probability of occurrence of carrier recombination that contributes to light emission, thus improving its light emission efficiency. Further, the probability of Auger electron generation becomes low in the quantum dot 1; hence, a ligand coordinating with the periphery of the quantum dot 1 is less likely to dissolve, thus improving the reliability of the quantum dot 1. Furthermore, heat generation resulting from an ineffective current that is generated in the light-emitting device including the quantum dot 1, and that does not contribute to light emission becomes weak, thus improving the light emission efficiency of the light-emitting device and elongating the lifetime of the light-emitting device. These effects are typically found conspicuously when the light-emitting device is driven at a high current, during which the probability of occurrence of Auger recombination is high.

Further in this embodiment, the thickness of the quantum well layer 12 formed on each crystal face forming the quantum dot 1 varies from location to location on the inner barrier layer 11. This enables the quantum dot 1 according to this embodiment to limit quantum level widening in the in-plane direction when compared to a quantum dot that includes the quantum well layer 12 having a uniform thickness. The quantum dot 1 according to this embodiment can consequently keep the light-emission half-value breadth narrow. Further, the wavelength of light from the quantum dot 1 does not vary depending on the exit direction of the light, because the quantum well layer 12, which is a region where light is emitted, has a uniform thickness in a single face orientation. For instance, the wavelength is not different between light that goes out vertically from the quantum well layer 12 and light that goes out obliquely from the quantum well layer 12. This can prevent further increase in the light-emission half-value breadth of the quantum dot 1.

Furthermore in this embodiment, the band gap of the outer barrier layer 13, which is an outer core in the quantum well layer 12, and the band gap of the inner barrier layer 11, which is an inner core in the quantum well layer 12, are asymmetric, and in particular, the band gap of the outer barrier layer 13 is larger. Accordingly, the quantum dot 1 can prevent the wave function from seeping further outside the outer barrier layer 13 and can stably control the level of the quantum well layer 12. The quantum dot 1 can thus prevent increase in the light-emission half-value breadth more efficiently.

Further, the quantum dot 1 according to this embodiment, which is configured such that the band gap of the outer barrier layer 13 is larger than the band gap of the inner barrier layer 11, can avoid carrier seepage from the quantum well layer 12.

Figure 8:
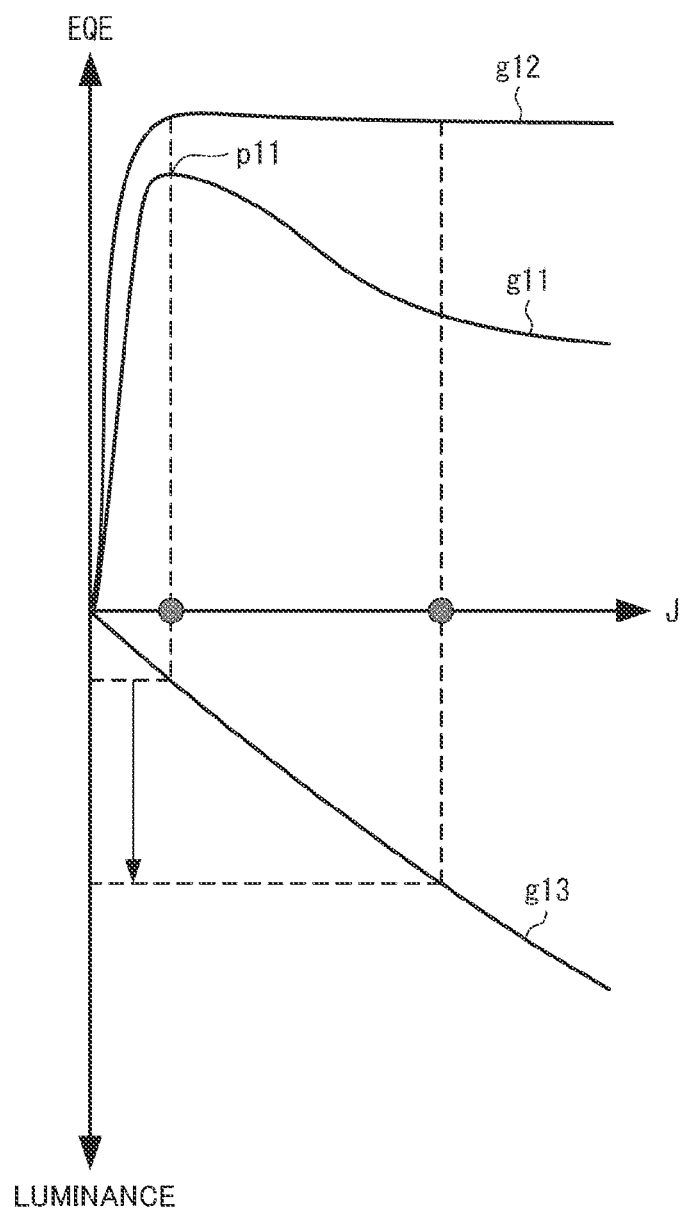
FIG. 8 illustrates a characteristic of a light-emitting device.

Here, the following describes a characteristic of the quantum dot 1 in comparison to a characteristic of a known quantum dot. FIG. 8 illustrates a characteristic of a self-luminous device. In FIG. 8, the lateral axis denotes current, and the vertical axis denotes EQE and luminance. Graph g11 shows a characteristic indicated by the relationship between the current and the EQE in the known quantum dot. Graph g12 shows a characteristic indicated by the relationship between the current and the EQE in the quantum dot 1 according to this embodiment. Graph g13 shows the relationship between the current and the luminance.

A self-luminous device of the known quantum dot has a characteristic where the EQE exhibits peak p11 on a low-injection side and sharply lowers thereafter along with increase in the current. Hence, high-luminance light emission with very low EQE has to be performed when high luminance is required, such as in a case of HDR drive, or in a case of use for signage; thus, heat generation resulting from an ineffective current that does not contribute to light emission is a problem. Further, a rise in pixel temperature, which accelerates deterioration, induces reliability reduction, color change, or both.

The characteristic relating to the relationship between the current and EQE of a self-luminous device is determined by (1) the probability of non-radiative recombination resulting from a surface defect in its quantum dot, (2) the probability of radiative recombination in the core of the quantum dot, and (3) the probability of trione Auger transition. The foregoing probabilities in (1) to (3) increase proportionately with the first power, second power and third power of a current, respectively, along with increase in the density of injected carriers. A large EQE reduction in high injection occurs due to a considerable increase in the probability of trione Auger transition.

The quantum dot 1 according to this embodiment is configured such that a layer that corresponds to the core of a known quantum dot is replaced with the quantum well layer 12, which is a two-dimensional light-emitting layer having, in each face forming the quantum dot, a uniform thickness in the diameter direction of the quantum dot 1. Radiative recombination occurs between quantum levels rendered discrete in the thickness direction of this light-emitting layer; hence, the emission wavelength can be regulated with the thickness of the light-emitting layer. Moreover, carriers injected into the quantum well layer 12, which is a light-emitting layer, receive no in-plane constraint; hence, a trione Auger process does not occur unless higher carrier injection than the known quantum dot is performed. Accordingly, a self-luminous device that includes a light-emitting layer containing the quantum dot 1 according to this embodiment has EQE that does not lower even when the self-luminous device is driven at a large current.

Method for Manufacturing Quantum Dot 1

Figure 9:
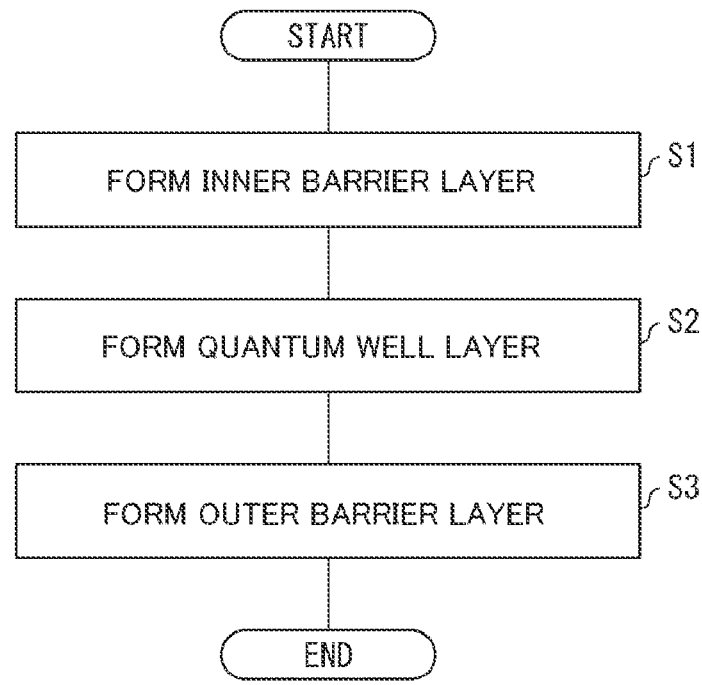
FIG. 9 is a flowchart illustrating a method for manufacturing the quantum dot according to the first embodiment of the disclosure.

Each layer of the quantum dot 1 is synthesized by causing the material within an organic solvent to react. FIG. 9 is a flowchart illustrating a method for manufacturing the quantum dot 1.

Inner-Barrier-Layer Formation Step

Step S1 (inner-barrier-layer formation step) is forming the inner barrier layer 11. Examples of the method of manufacturing the quantum dot 1 include a heating method, hot injection, a micro-wave assist method, and a continuous flow method. The following describes these methods individually.

Heating Method

The heating method is a method of mixing a material in an organic solvent, followed by heating to cause the material to react through thermal dissolution to thus synthesize the layers of the quantum dot 1. The heating method uses trioctylphosphine (TOP) or trioctylphosphine oxide (T-TOPO) as an organic solvent, uses dimethylcadmium as a group II raw material and uses, as a group VI raw material, a TOP complex of a desired device, such as S, Se or Te, or an organic metal compound combined with a methyl group, an ethyl group or other groups. The group II and group VI raw materials are combined in the organic solvent and undergo heating to about 300° C. for thermal dissolution, and the degree of supersaturation of the group II and group VI devices is kept high within the organic solvent, to thus promote a reaction into a group II-VI compound, thereby synthesizing the inner barrier layer 11, which is the core of the quantum dot 1.

Hot Injection

The hot injection is a method of injecting raw materials rapidly into a heated organic solvent, to thus generate uniform crystal-growth nuclei at high density by using the supersaturation near the injected region. In the hot injection, the raw materials that are used undergoes heating to about 300° C. with TOP or T-TOPO used as an organic solvent, and the group II and group VI raw materials undergo rapid injection into the organic solvent, to thus locally sharply raise the degree of supersaturation mainly in the injected region to generate uniform crystal-growth nuclei at high density. A high degree of supersaturation is locally found near the injected region; hence, the raw materials consumed during the growth of the growth nucleus are supplied at all times through diffusion from a surrounding region having a low degree of supersaturation due to density gradient, thus maintaining quantum dot growth. In this method, alkylphosphine oxides, including alkylphosphine as well as trioctylphosphine or trioctylphosphine oxide, long-chain carboxylic acids, including oleic acid, or long-chain amines, including oleylamine, are added as a surfactant or ligand that avoids aggregation of quantum dots, because nuclei are generated at high density.

Micro-Wave Assist Method

The micro-wave assist method is a method of heating a growth raw material selectively with micro waves. This method, which includes selective heating, has high reaction controllability and can thus raise, in a short time, temperature to a temperature range that is required for a reaction. Further, the method can synthesize a quantum dot more easily than the injection method and can do so even under atmosphere. A micro wave undergoes selective resonance absorption by a molecule having polarization; thus, using chalcogenide for instance that is applicable to the wavelength of the micro wave, as a raw material enables this selective raw material to be heated, thereby achieving control over the growth of the quantum dot. Based on this feature, the raw material needs to have polarization, and a raw material that is different from those used in the foregoing first and second methods is used. An example of the raw material is a mixed solution containing cadmium stearate, an alkane solvent and a group VI powder.

Continuous Flow Method

The continuous flow method is a method of performing a reaction of a raw material while allowing an organic solvent with the raw material mixed therein to flow, to make a nucleus generation reaction and a growth reaction in mutually different reactors. The nucleus generation reaction and the growth reaction are made in mutually different reactors, thereby enabling a suitable temperature gradient to be established precisely and enabling each reaction to be controlled precisely. This method, which relatively facilitates control over crystal growth, is suitable for manufacture. The continuous flow method enables the quantum dot 1 to grow in any of an organic solution and a vapor phase including steam of an organic solution, as described in the foregoing three methods. In the continuous flow method, an organic solvent and group II and group VI raw materials are mixed together, then, the raw materials are moved along the flow of a liquid phase or vapor phase, and then, a temperature gradient that is suitable for a nucleus formation stage, which is the start of the growth of the quantum dot 1, and a temperature gradient that is suitable for a crystal growth stage are individually established, thereby enabling nucleus formation and grown reaction to be controlled precisely in separate reactors. The nucleus formation and the crystal growth are divided in separate containers and are transferred between the containers along the flow of the liquid phase or vapor phase, thereby enabling conditions that are suitable for the respective stages to be individually controlled precisely.

It is important in crystal growth to maintain a high degree of supersaturation of a raw material that is a driving force for nucleus formation and crystal growth, and based on a difference in means for achieving and maintaining the condition for the crystal growth, the foregoing four kinds of methods, for instance, have been developed.

To synthesize the quantum dot 1, a synthesis condition for synthesizing each layer of the quantum dot 1 needs to be controlled. To be specific, the synthesis condition for each layer of the quantum dot 1 needs to be controlled in such a manner that, as illustrated in FIG. 2, the surface of the quantum dot 1 has such a shape as to terminate only in a (111) equivalent face and a (100) equivalent face. An example of such a method of causing a particular crystal face to appear selectively is controlling, in the process step of synthesizing each layer, the PH of a solvent with materials mixed to fall within a particular range. An experiment has revealed that the solvent's PH needs to be maintained in a range of 9 to 11 in order to obtain the crystal faces shown in FIG. 2. The PH within this range exhibits weak basicity with a higher H+ concentration than the neutral condition, i.e., PH=7; thus, an intermediate reaction between H+ and a raw material species seems to relate to a mechanism for preferentially forming a particular crystal face.

Further, when a group II-VI crystal of, but not limited to, ZnS or CdS, or a group II-V crystal of, but not limited to, InN is used as an alternative method, it is known that a (111) equivalent face appears by relatively reducing group VI or group V raw materials. This is because that a reduction in the group V or group VI raw materials relatively increases non-bonding orbitals in a (111) equivalent face having high face density of a bonding orbital.

Selecting any of the foregoing as an earliest-stage condition for forming the quantum dot 1 obtains the inner barrier layer 11, which constitutes a core that defines a crystal face where the quantum well layer 12 is formed in a posterior process step.

Here, the temperature may be lowered to stop the reaction once, followed by heating for performing a thermal process. Performing a thermal process after stopping a reaction typically can reduce defects on the surface of the inner barrier layer 11, which is the core of the quantum dot 1.

Quantum-Well-Layer Formation Step

The next process step is performing continuous growth by raising the temperature of a solvent to a desired crystal growth temperature, and by injecting the material of the quantum well layer 12 into a reaction container. To be specific, Step S2 (quantum-well-layer formation step) in FIG. 9 is performed, where the quantum well layer 12 is formed onto at least a part of the inner barrier layer 11. Here in Step S2, the quantum well layer 12 is formed so as to be divided between faces having different orientations.

The reason why the quantum well layer 12 is divided between the faces having different orientations is that there is a large difference in the diffusion energy of the raw material between the faces having different orientations. For a raw material species to diffuse over the boundary between face orientations, the raw material species needs to have kinetic energy or thermal energy that exceeds a barrier corresponding to the diffusion energy difference of the raw material species. However, this energy cannot be supplied to the raw material species under an ordinary condition for manufacturing a quantum dot. Further, the raw material species can be diffused over the faces by regulating the degree of supersaturation of a solution. However, it is impossible under the ordinary condition for manufacturing the quantum dot to increase the degree of supersaturation of the solution to such an extent that the raw material species diffuses over the faces.

Accordingly, under the ordinary condition for manufacturing the quantum dot, growth is performed, with the layer divided for each face, on crystal faces that are limited at the stage of synthesizing the inner barrier layer 11. Here in the nucleus formation, since the crystal faces are limited to a (111) equivalent face and a (100) equivalent face, the quantum well layer 12 grows on these individual crystal faces while separated for each face, as illustrated in FIG. 5 and FIG. 6. Thus, controlling the face orientation of the nucleus in advance at the stage of synthesizing the inner barrier layer 11 can produce the quantum dot 1 that has the structure shown in FIG. 2. In other words, the thickness of the quantum well layer 12 varies from location to location on the inner barrier layer 11 for the foregoing reason.

Outer-Barrier-Layer Formation Step

After growing the quantum well layer 12, lowering the temperature to stop the reaction once, followed by heating to promote the reaction again to thus grow the outside, outer barrier layer 13 completes the quantum dot 1. In other words, Step S3 (outer-barrier-layer formation step) in FIG. 9 is performed, where the outer barrier layer 13 is formed onto a surface of the quantum well layer 12 opposite to a surface adjacent to the inner barrier layer 11.

Method of Forming Light-Emitting Layer Containing Quantum Dot 1

The light-emitting layer containing the quantum dot 1 is formed through, for instance, application or printing including patterning. A colloidal solution with the quantum dot 1 dispersed in a solvent is used in either case. For instance, the light-emitting layer containing the quantum dot 1 may be formed by applying a solution with the quantum dot 1 dispersed, followed by patterning through photolithography. Alternatively, the light-emitting layer containing the quantum dot 1 may be formed by applying, through an ink-jet method for instance, a dispersed solution containing dispersed quantum dots 1 and having suitable viscosity.

Method of Analyzing Structure of Quantum Dot 1

The following describes a method of analyzing the structure of the quantum dot 1. The structure of the quantum dot 1 can be simply analyzed by observing the cross-section of the light-emitting device with a known TEM. For instance, observing a surface crossing the cross-section of the quantum dot 1 contained in the light-emitting layer can determine the shape of the quantum well layer 12, and the presence or absence of a surface or whether the thickness of the surface is uniform or non-uniform. Further, the device analysis in each region of the quantum dot 1 can be performed through EDX.

Furthermore, the structure of the quantum dot 1 may be analyzed through a three-dimensional atom probe (3DAP) method. The 3DAP method enables structures including a 3D conformation to be analyzed at a high spatial resolution that corresponds to one-tenth or smaller of the size of the quantum dot 1 and enables a trace device of about 100 ppm to be analyzed. Using the 3DAP method enables stereoscopic device mapping of a sample cut through FIBS and having a volume of several-ten nms square×100 nm thickness. The 3DAP method, which can offer three-dimensional device mapping data and can visualize the species, composition and distribution of a device, enables the stereoscopic structure of the quantum dot 1 to be analyzed with high accuracy.

Further, the crystal system of the quantum dot 1 can be measured through X-ray diffraction. With a thickness of about 20 nm, diffraction peaks from the individual crystal faces of the quantum dot 1 can be detected through typical powder X-ray diffraction with sufficient accuracy. This can offer the crystal faces of the quantum dot 1 and can automatically measure its crystal system.

Second Embodiment

The following describes another embodiment of the disclosure. It is noted that for convenience in description, components that have the same functions as components that have been described in the foregoing embodiment will be denoted by the same signs, and the description of them will not be repeated.

Figure 10:
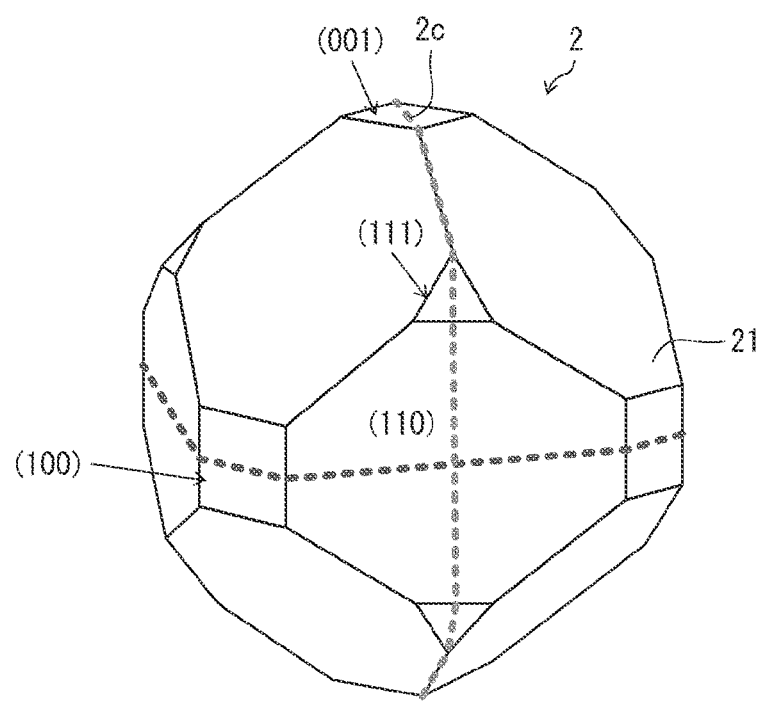
FIG. 10 is a perspective view of the structure of a quantum dot according to a second embodiment of the disclosure.
Figure 11:
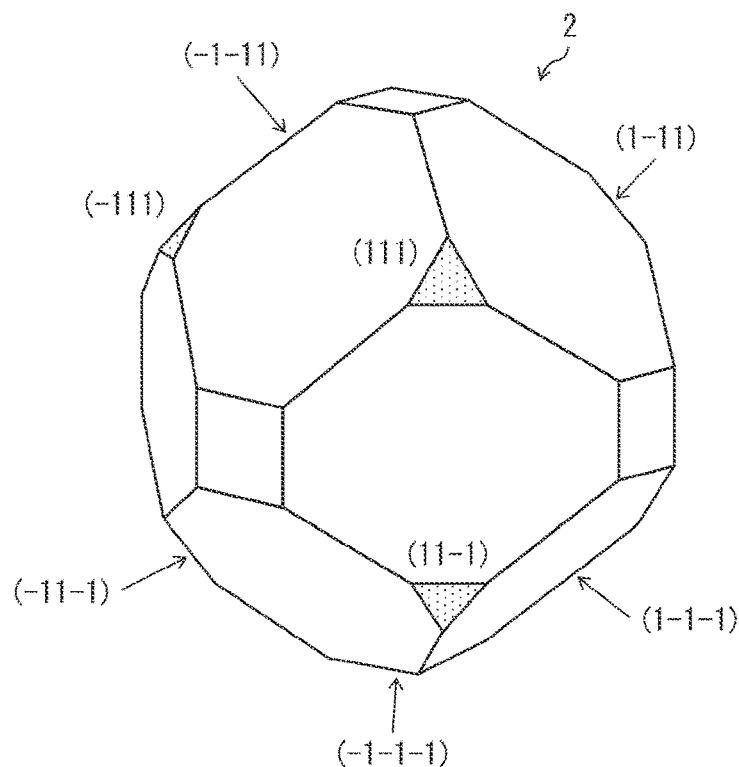
FIG. 11 illustrates the face orientations of the individual crystal faces of the quantum dot according to the second embodiment of the disclosure.
Figure 12:
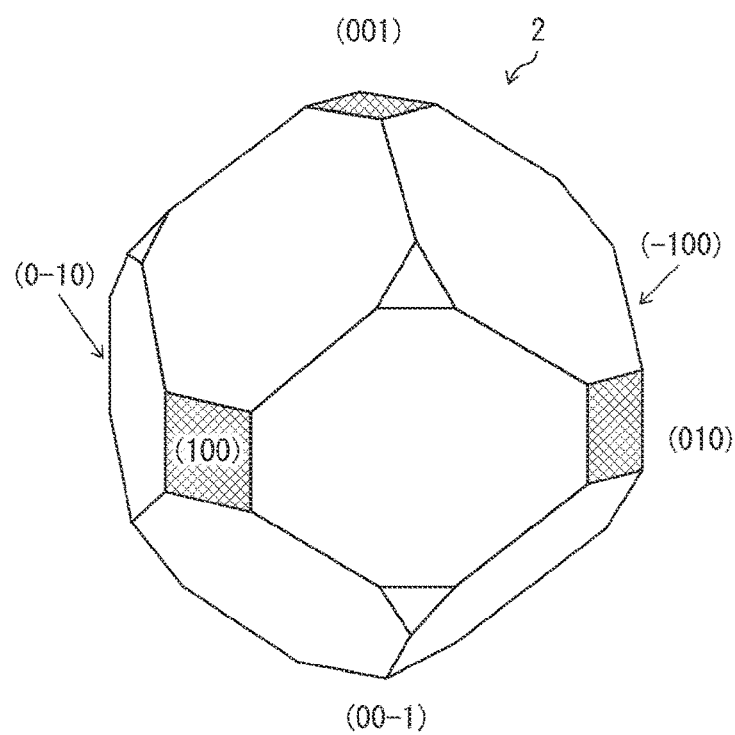
FIG. 12 illustrates the face orientations of the individual crystal faces of the quantum dot according to the second embodiment of the disclosure.
Figure 13:
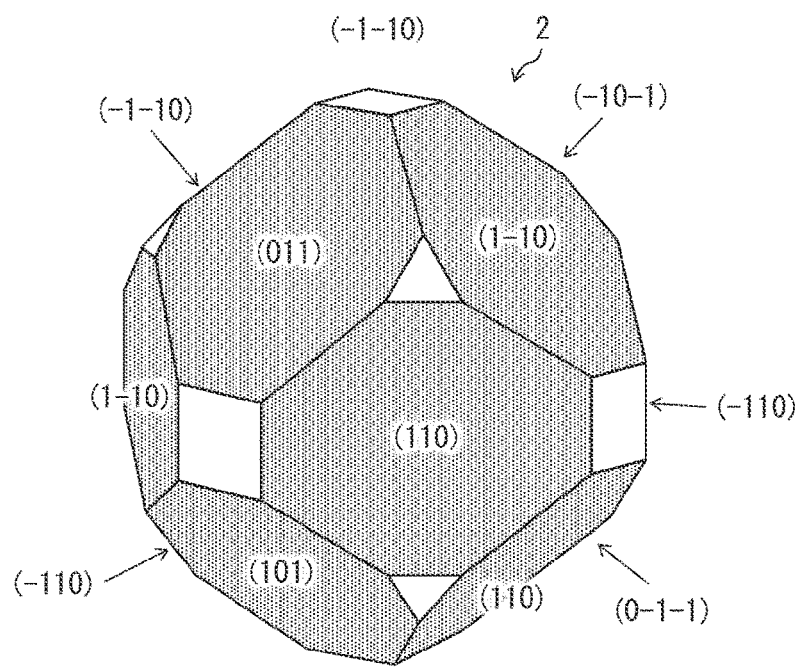
FIG. 13 illustrates the face orientations of the individual crystal faces of the quantum dot according to the second embodiment of the disclosure.
Figure 14:
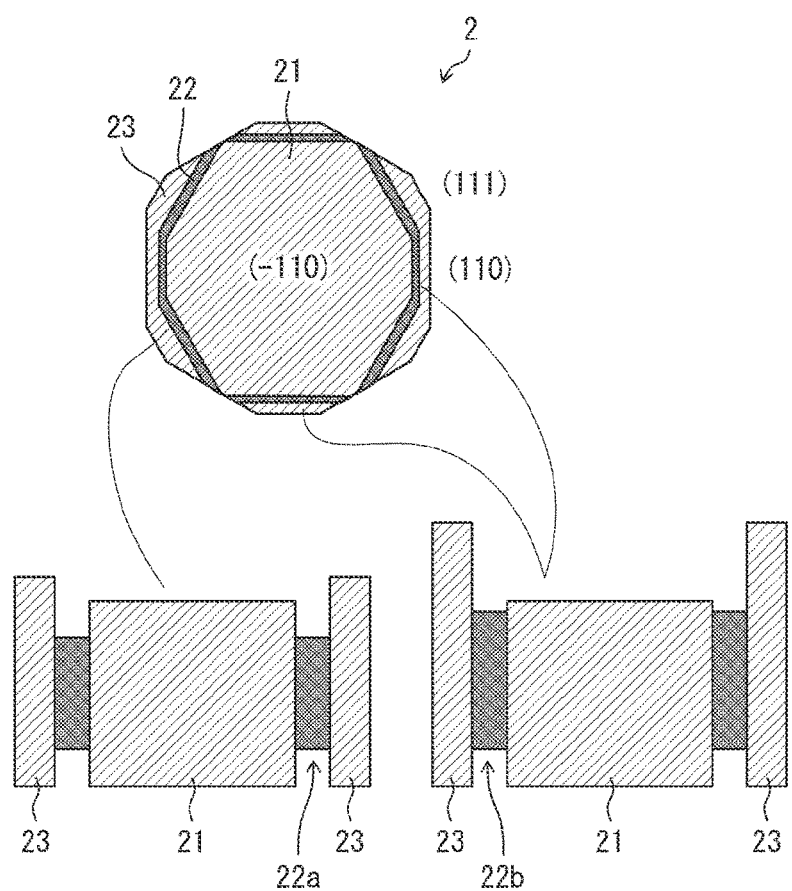
FIG. 14 is a sectional view of the quantum dot according to the second embodiment of the disclosure.

FIG. 10 is a perspective view of the structure of a quantum dot 2 according to the second embodiment. FIG. 11, FIG. 12, and FIG. 13 illustrate the individual crystal face orientations of the quantum dot 2. Further, FIG. 14 is a sectional view of the quantum dot 2 taken along a plane 2c shown in FIG. 10 and illustrates a band structure. The quantum dot 2 includes an inner barrier layer 21, a quantum well layer 22, and an outer barrier layer 23, as illustrated in FIG. 14.

The inner barrier layer 21 is an icosahexahedron having the following: (a) (100), (−100), (010), (0−10), (001), and (00−1) faces that are quadrangular; (b) (101), (−101), (011), (0−11), (110), (−110), (1−10), (−1−10), (10−1), (−10−1), (01−1), and (0−1−1) faces that are octagonal; and (c) (111), (−111), (1−11), (−1−11), (11−1), (−11−1), (1−1−1), and (−1−1−1) faces that are triangular.

FIG. 11 illustrates crystal faces of the quantum dot 2 that are equivalent to the (111) face. The faces equivalent to the (111) face are illustrated in FIG. 11 with hatches. Among the crystal faces of the quantum dot 2, the (−111), (1−11), (−1−11), (11−1), (−11−1), (1−1−1), and (−1−1−1) faces are equivalent to the (111) face.

FIG. 12 illustrates crystal faces of the quantum dot 2 that are equivalent to the (100) face. The faces equivalent to the (100) face are illustrated in FIG. 12 with hatches. Among the crystal faces of the quantum dot 2, the (−100), (010), (0−10), (001), and (00−1) faces are equivalent to the (100) face.

FIG. 13 illustrates crystal faces of the quantum dot 2 that are equivalent to the (101) face. The faces equivalent to the (101) face are illustrated in FIG. 13 with hatches. Among the crystal faces of the quantum dot 2, the (−101), (011), (0−11), (110), (−110), (1−10), (−1−10), (10−1), (−10−1), (01−1), and (0−1−1) faces are equivalent to the (101) face.

The quantum well layer 22 of the quantum dot 2 is discontinuous in its circumferential direction, and the thickness of the quantum well layer 22 varies from face orientation to face orientation.

In FIG. 14, the quantum well layer 22 formed on a crystal face equivalent to the (111) face is thicker than the quantum well layer 22 formed on a crystal face equivalent to the (100) face, and the quantum well layer 22 formed on a crystal face equivalent to the (110) face. Further, the quantum well layer 22 formed on the crystal face equivalent to the (100) face is thicker than the quantum well layer 22 formed on the crystal face equivalent to the (110) face.

Further, there is a region that is absent from the quantum well layer 22 (i.e., the quantum well layer 22 is discontinued) at, as illustrated in FIG. 14, the boundary between the (011) face and the (1−10) face, the boundary between the (101) face and the (110) face and other boundaries. In other words, the quantum well layer 22 is not formed in the direction of the boundary between the (011) face and the (1−10) face. As described, the thickness of the quantum well layer 22 varies from face orientation to face orientation (i.e., the quantum well layer 22 has a plurality of thicknesses), and the presence or absence of the quantum well layer 22 varies from face orientation to face orientation.

The quantum dot 2 can be obtained by keeping the solvent's PH low, for instance, at 3 to 5 inclusive, in the method for manufacturing the quantum dot 1 according to the first embodiment.

A light-emitting device that contains the quantum dot 2 has EQE that does not lower in high injection; this characteristic is similar to the characteristic shown in FIG. 8. However, the quantum well layer 22 is thin and thus has a wider band gap in some face orientations. Hence, for light emission that occurs in the thin quantum well layer 22, light having a shorter wavelength is emitted. In FIG. 14 for instance, a quantum well layer 22b is thinner than a quantum well layer 22a; hence, light having a shorter wavelength than the quantum well layer 22a seems to be produced when main light emission is found in the quantum well layer 22a and when light emission occurs in the quantum well layer 22b.

Nevertheless, carrier recombination and exciton generation that contribute to light emission typically occur in a layer having a narrower band gap. Further, the probability of energy transfer from the quantum well layer 22a, having a narrower band gap, to the quantum well layer 22b, having a wider band gap, is low sufficiently. Accordingly, the light emission obtained from the quantum well layer 22a is sufficiently stronger than the light emission obtained from the quantum well layer 22b, thereby preventing further increase in half-value breadth and further reduction in EQE.

In other words however, the quantum well layer 22 of the quantum dot 2, which is a quantum well layer having a thickness that varies from face orientation to face orientation, offers an emission wavelength having two or more peaks. The quantum dot 2 thus emits light of two or more colors by using the differences in thickness between the faces of the quantum well layer 22. When a main emission wavelength is R for instance, controlling the core size of the quantum dot offers G light emission, because the thin quantum well layer 22 emits light at a shorter wavelength. In this case, a single quantum dot 2 offers two colors of light emission: R and G. When main light emission is G, two colors of light emission: G and B can be achieved for the same reason as the instance where the main light emission is R. Further use of this effect enables a light-emitting layer having a mixture of the quantum dot 2 that emits R/G light and the quantum dot 2 that emits GB light, to emit white light.

Third Embodiment

The following describes another embodiment of the disclosure. It is noted that for convenience in description, components that have the same functions as components that have been described in the foregoing embodiments will be denoted by the same signs, and the description of them will not be repeated.

Figure 15:
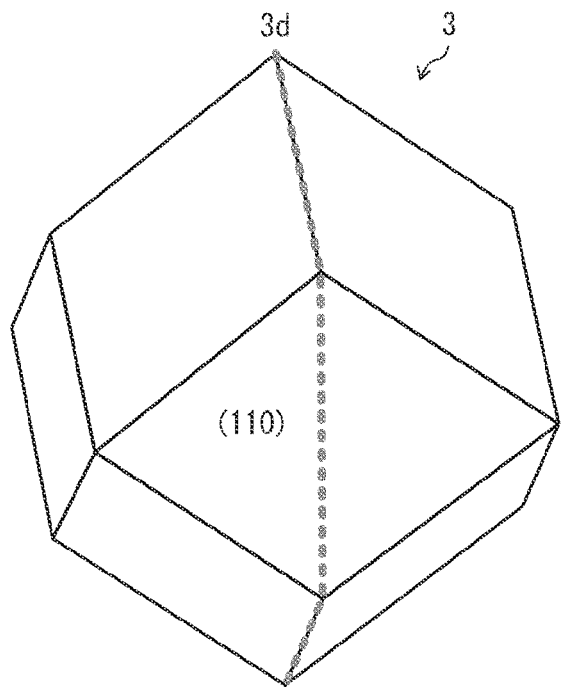
FIG. 15 is a perspective view of the structure of a quantum dot according to a third embodiment of the disclosure.
Figure 16:
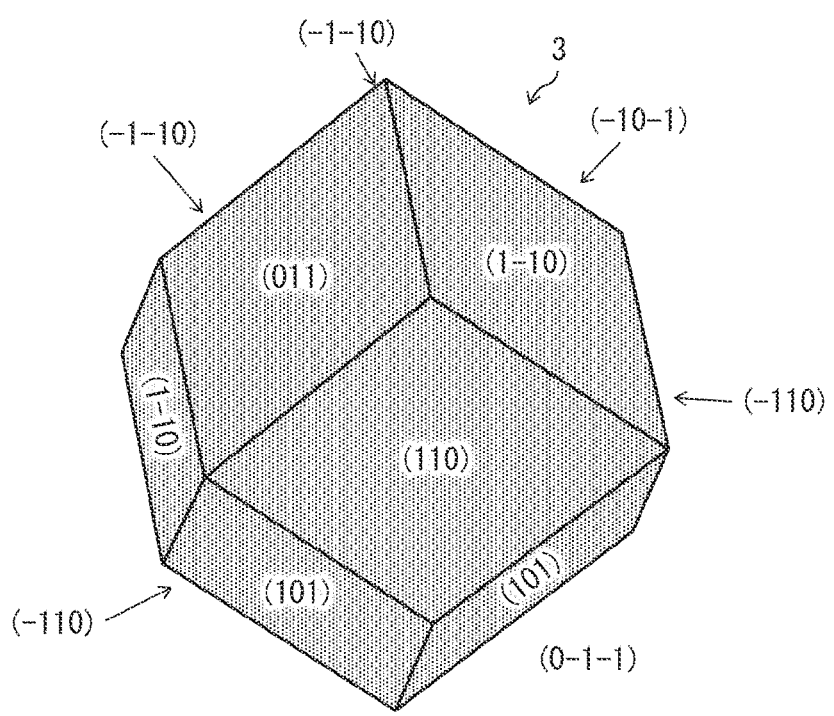
FIG. 16 illustrates the face orientations of the individual crystal faces of the quantum dot according to the third embodiment of the disclosure.
Figure 17:
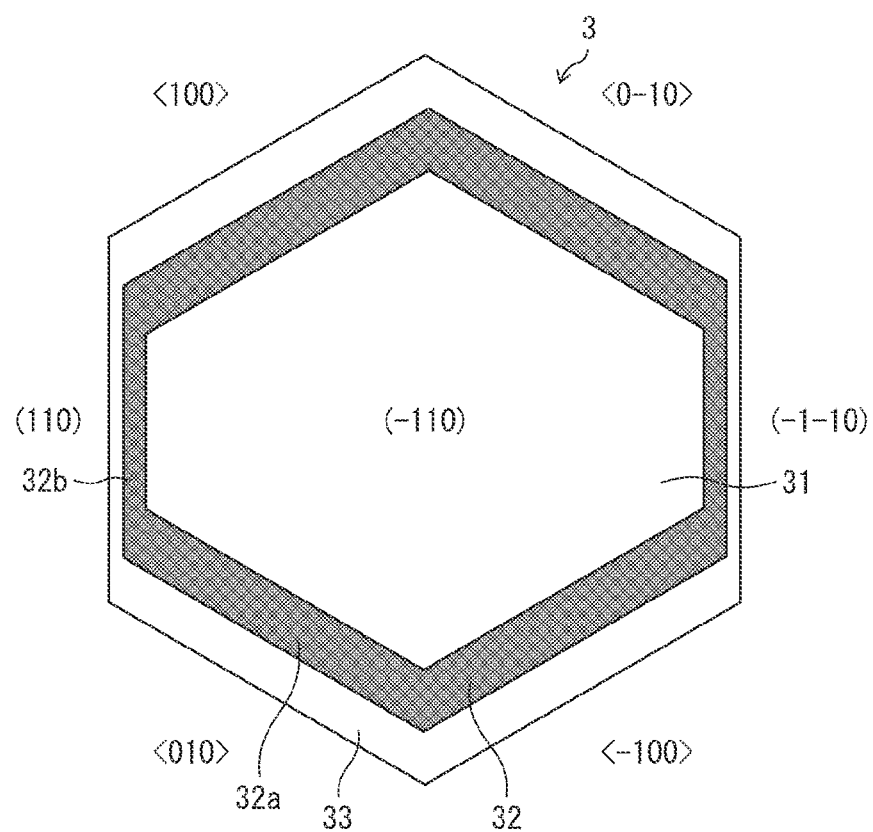
FIG. 17 is a sectional view of the quantum dot according to the third embodiment of the disclosure.

FIG. 15 is a perspective view of the structure of a quantum dot 3 according to this embodiment. FIG. 16 illustrates the individual crystal face orientations of the quantum dot 3. FIG. 17 is a sectional view of the quantum dot 3 taken along a plane 3d shown in FIG. 15. The quantum dot 3 includes an inner barrier layer 31, a quantum well layer 32, and an outer barrier layer 33, as illustrated in FIG. 17. Further, each face forming the quantum dot 3 is composed in a single face orientation.

The inner barrier layer 31 is a dodecahedron having the following: (101), (−101), (011), (0−11), (110), (−110), (1−10), and (−1−10) faces that are quadrangular; and (10−1), (−10−1), (01−1), and (0−1−1) faces that are quadrangular.

The faces equivalent to the (101) face are illustrated in FIG. 16 with hatches. Among the crystal faces of the quantum dot 3, the (−101), (011), (0−11), (110), (−110), (1−10), (−1−10), (10−1), (−10−1), (01−1), and (0−1−1) faces are equivalent to the (101) face.

The thickness of the quantum well layer 32 varies from face orientation to face orientation. The quantum well layer 32 in the face orientation of a crystal face equivalent to the (110) face is thinner than the quantum well layer 32 in the face orientations of the (100), (0−10), (−100), and (010), as illustrated in FIG. 17.

The quantum dot 3 can be obtained by setting the solvent's PH to, for instance, 12 or greater, in a method similar to the method for manufacturing the quantum dot 1 according to the first embodiment. The quantum dot 3, which terminates in a single chemically stable face, has high stability.

Summary

A quantum dot according to a first aspect of the disclosure includes the following: an inner barrier layer; a quantum well layer formed on at least a part of the inner barrier layer, wherein the presence or absence of the quantum well layer or the thickness of the quantum well layer varies from location to location on the inner barrier layer; and an outer barrier layer formed on a surface of the quantum well layer opposite to a surface adjacent to the inner barrier layer.

In the foregoing configuration, the quantum well layer, formed between the inner barrier layer and the outer barrier layer, involves recombination of carriers injected into the quantum dot. The quantum well layer, which confines carriers weakly in the in-plane direction of each crystal face, confines the injected carriers two-dimensionally. The quantum well layer can thus confine the injected carriers two-dimensionally and weakly rather than three-dimensionally and strongly. This can reduce the probability of occurrence of Auger recombination, thereby improving light emission efficiency.

The quantum dot according to a second aspect of the disclosure may be configured, in the first aspect, that the quantum well layer is formed on at least some of crystal faces of the inner barrier layer, and the presence or absence of the quantum well layer or the thickness of the quantum well layer varies from face orientation to face orientation.

The foregoing configuration can reduce the probability of occurrence of the Auger recombination, thereby improving the light emission efficiency.

The quantum dot according to a third aspect of the disclosure may be configured, in the first aspect, such that the quantum well layer has a thickness of 3 to 6 nm inclusive.

The foregoing configuration can reduce the probability of occurrence of the Auger recombination, thereby improving the light emission efficiency.

The quantum dot according to a fourth aspect of the disclosure may be configured, in the first aspect, such that the outer barrier layer has a thickness of 3 to 6 nm inclusive.

In the foregoing configuration, a quantum effect can enlarge a band gap toward a conduction band, can prevent electrons injected into the quantum well layer from seeping outside a wave function and can keep the quantum level of the quantum well layer constant.

The quantum dot according to a fifth aspect of the disclosure may be configured, in the first aspect, such that the inner barrier layer has a size of 6 nm or smaller.

The foregoing configuration enables a light-emitting layer of a light-emitting device that contains the quantum dot to be formed uniformly through application or other methods.

The quantum dot according to a sixth aspect of the disclosure may be configured, in the first aspect, such that the inner barrier layer is a tetradecahedron having (a) (100), (−100), (010), (0−10), (001), and (00−1) faces that are quadrangular, and (b) (111), (−111), (1−11), (−1−11), (11−1), (−11−1), (1−1−1), and (−1−1−1) faces that are hexagonal, and such that a quantum well layer formed on a crystal face equivalent to a (111) face is thicker than a quantum well layer formed on a crystal face equivalent to a (100) face.

The foregoing configuration can reduce the probability of occurrence of the Auger recombination, thereby improving the light emission efficiency.

The quantum dot according to a seventh aspect of the disclosure may be configured, in the first aspect, such that the inner barrier layer is an icosahexahedron having (a) (100), (−100), (010), (0−10), (001), and (00−1) faces that are quadrangular, (b) (101), (−101), (011), (0−11), (110), (−110), (1−10), (−1−10), (10−1), (−10−1), (01−1), and (0−1−1) faces that are octagonal, and (c) (111), (−111), (1−11), (−1−11), (11−1), (−11−1), (1−1−1), and (−1−1−1) faces that are triangular, and such that a quantum well layer formed on a crystal face equivalent to a (111) face is thicker than a quantum well layer equivalent to a (100) face and a quantum well layer equivalent to a (110) face.

The foregoing configuration can reduce the probability of occurrence of the Auger recombination, thereby improving the light emission efficiency.

The quantum dot according to an eighth aspect of the disclosure may be configured, in the first aspect, such that the inner barrier layer is a dodecahedron having (101), (−101), (011), (0−11), (110), (−110), (1−10), and (−1−10) faces that are quadrangular, and (10−1), (−10−1), (01−1), and (0−1−1) faces that are quadrangular, and such that a quantum well layer in the face orientation of a crystal face equivalent to a (110) face is thinner than quantum well layers in the face orientations of (100), (0−10), (−100), and (010).

The foregoing configuration can reduce the probability of occurrence of the Auger recombination, thereby improving the light emission efficiency.

The quantum dot according to a ninth aspect of the disclosure may be configured, in the first aspect, such that the quantum well layer is a quantum well layer having a thickness that varies from face orientation to face orientation, and such that the quantum well layer has an emission wavelength having two or more peaks.

The foregoing configuration enables the quantum dot that is used as a self-luminous device to emit light of two or more colors.

A self-luminous device according to a tenth aspect of the disclosure includes a light-emitting layer containing the quantum dot according to any one of the first to ninth aspects.

In the foregoing configuration, the quantum well layer, formed between the inner barrier layer and the outer barrier layer, involves recombination of carriers injected into the quantum dot. The quantum well layer, which confines carriers weakly in the in-plane direction of each crystal face, confines the injected carriers two-dimensionally. The quantum well layer can thus confine the injected carriers two-dimensionally and weakly rather than three-dimensionally and strongly. This can reduce the probability of occurrence of the Auger recombination, thereby improving the light emission efficiency.

A method for manufacturing a quantum dot according to an eleventh aspect of the disclosure includes the following: an inner-barrier-layer formation step of forming an inner barrier layer; a quantum-well-layer formation step of forming a quantum well layer onto at least a part of the inner barrier layer, wherein the presence or absence of the quantum well layer or the thickness of the quantum well layer varies from location to location on the inner barrier layer; and an outer-barrier-layer formation step of forming an outer barrier layer onto a surface of the quantum well layer opposite to a surface adjacent to the inner barrier layer.

In the foregoing configuration, the quantum well layer, formed between the inner barrier layer and the outer barrier layer, involves recombination of carriers injected into the quantum dot. The quantum well layer, which confines carriers weakly in the in-plane direction of each crystal face, confines the injected carriers two-dimensionally. The quantum well layer can thus confine the injected carriers two-dimensionally and weakly rather than three-dimensionally and strongly. This can reduce the probability of occurrence of the Auger recombination, thereby improving the light emission efficiency.

Additional Remarks 1

The first embodiment has described the quantum dot 1 that includes the quantum well layer 12 having a thickness that varies from face orientation to face orientation of the inner barrier layer 11. The structure of the quantum dot according to the disclosure is not limited to the foregoing embodiments. The quantum well layer 12 of the quantum dot needs to be formed on at least a part of the inner barrier layer 11, and its presence or absence or its thickness needs to vary from location to location on the inner barrier layer 11. For instance, the quantum well layer 12 may be formed in the form of an island on a part of the inner barrier layer 11. Further, the presence or absence of the quantum well layer 12 or the thickness of the quantum well layer 12 may vary from orientation to orientation. For instance, the presence or absence of the quantum dot or the thickness of the quantum dot may vary from face orientation to face orientation of the inner barrier layer 11 and/or quantum well layer 12.

Additional Remarks 2

The disclosure is not limited to the foregoing embodiments. Various modifications can be devised within the scope of the claims. An embodiment that is obtained in combination, as appropriate, with technical means disclosed in the respective embodiments is also included in the technical scope of the disclosure. Furthermore, combining the technical means disclosed in the respective embodiments can form a new technical feature.

The invention claimed is:

1. A quantum dot comprising:
an inner barrier layer;
a quantum well layer formed on at least a part of the inner barrier layer, wherein a presence or absence of the quantum well layer or a thickness of the quantum well layer varies from location to location on the inner barrier layer; and
an outer barrier layer formed on a surface of the quantum well layer opposite a surface adjacent to the inner barrier layer, wherein
the inner barrier layer is a tetradecahedron having (a) (100), (−100), (010), (0−10), (001), and (00−1) faces that are quadrangular, and (b) (111), (−111), (1−11), (−1−11), (11−1), (−11−1), (1−1−1), and (−1−1−1) faces that are hexagonal, and a first portion of the quantum well layer formed on a crystal face equivalent to a (111) face is thicker than a second portion of the quantum well layer formed on a crystal face equivalent to a (100) face.

2. The quantum dot according to claim 1, wherein the quantum well layer has a thickness of 3 to 6 nm inclusive.

3. The quantum dot according to claim 1, wherein the outer barrier layer has a thickness of 3 to 6 nm inclusive.

4. The quantum dot according to claim 1, wherein the inner barrier layer has a size of 6 nm or smaller.

5. The quantum dot according to claim 1, wherein the quantum well layer has an emission wavelength having two or more peaks.

6. A self-luminous device comprising a light-emitting layer containing the quantum dot according to claim 1.

7. A quantum dot comprising:
an inner barrier layer;
a quantum well layer formed on at least a part of the inner barrier layer, wherein a presence or absence of the quantum well layer or a thickness of the quantum well layer varies from location to location on the inner barrier layer; and
an outer barrier layer formed on a surface of the quantum well layer opposite a surface adjacent to the inner barrier layer, wherein
the inner barrier layer is an icosahexahedron having (a) (100), (−100), (010), (0−10), (001), and (00−1) faces that are quadrangular, (b) (101), (−101), (011), (0−11), (110), (−110), (1−10), (−1−10), (10−1), (−10−1), (01−1), and (0−1−1) faces that are octagonal, and (c) (111), (−111), (1−11), (−1−11), (11−1), (−11−1), (1−1−1), and (−1−1−1) faces that are triangular, and
a first portion of the quantum well layer formed on a crystal face equivalent to a (111) face is thicker than a second portion of the quantum well layer formed on a crystal face equivalent to a (100) face, and a third portion of the quantum well layer formed on a crystal face equivalent to a (110) face.

8. The quantum dot according to claim 7, wherein the quantum well layer has a thickness of 3 to 6 nm inclusive.

9. The quantum dot according to claim 7, wherein the outer barrier layer has a thickness of 3 to 6 nm inclusive.

10. The quantum dot according to claim 7, wherein the inner barrier layer has a size of 6 nm or smaller.

11. The quantum dot according to claim 7, wherein the quantum well layer has an emission wavelength having two or more peaks.

12. A self-luminous device comprising a light-emitting layer containing the quantum dot according to claim 7.

13. A quantum dot comprising:
an inner barrier layer;
a quantum well layer formed on at least a part of the inner barrier layer, wherein a presence or absence of the quantum well layer or a thickness of the quantum well layer varies from location to location on the inner barrier layer; and
an outer barrier layer formed on a surface of the quantum well layer opposite a surface adjacent to the inner barrier layer, wherein
the inner barrier layer is a dodecahedron having (101), (−101), (011), (0−11), (110), (−110), (1−10), and (−1−10) faces that are quadrangular, and (10−1), (−10−1), (01−1), and (0−1−1) faces that are quadrangular, and
one portion of the quantum well layer in a face orientation of a crystal face equivalent to a (110) face is thinner than other portions of the quantum well layer in face orientations of crystal faces equivalent to the (100), (0−10), (−100), and (010) faces.

14. The quantum dot according to claim 13, wherein the quantum well layer has a thickness of 3 to 6 nm inclusive.

15. The quantum dot according to claim 13, wherein the outer barrier layer has a thickness of 3 to 6 nm inclusive.

16. The quantum dot according to claim 13, wherein the inner barrier layer has a size of 6 nm or smaller.

17. The quantum dot according to claim 13, wherein the quantum well layer has an emission wavelength having two or more peaks.

18. A self-luminous device comprising a light-emitting layer containing the quantum dot according to claim 8.

* * * * *